United States Patent [19]
Harris et al.

[11] Patent Number: 5,763,902
[45] Date of Patent: Jun. 9, 1998

[54] INSULATED GATE BIPOLAR TRANSISTOR HAVING A TRENCH AND A METHOD FOR PRODUCTION THEREOF

[75] Inventors: Christopher Harris, Sollentuna; Ulf Gustafsson, Linköping; Mietek Bakowski, Skultuna, all of Sweden

[73] Assignee: ABB Research Ltd., Zurich, Switzerland

[21] Appl. No.: 637,105

[22] Filed: Apr. 24, 1996

[51] Int. Cl.$^6$ .................................................. H01L 29/74
[52] U.S. Cl. .................. 257/139; 257/144; 257/622; 257/77
[58] Field of Search ........................... 257/77, 139, 622, 257/378, 147, 153, 144

[56] References Cited

U.S. PATENT DOCUMENTS

| | | | |
|---|---|---|---|
| 4,223,328 | 9/1980 | Terasawa et al. | 257/136 |
| 4,466,173 | 8/1984 | Baliga | 438/137 |
| 5,079,602 | 1/1992 | Harada | 257/341 |
| 5,173,435 | 12/1992 | Harada | 438/138 |
| 5,233,215 | 8/1993 | Baliga | 257/77 |
| 5,396,087 | 3/1995 | Baliga | 257/139 |
| 5,397,717 | 3/1995 | Davis et al. | 438/274 |
| 5,506,421 | 4/1996 | Palmour | 257/77 |

OTHER PUBLICATIONS

Baliga et al., Gate Turn-Off Capability of Depletion-Mode Thyristors, IEEE Electron Device Letters, vol. 10, No. 10, Oct. 1989, pp. 464–466.

Nishizawa et al., A Low-Loss High-Speed Switching Device: The 2500-V 300-A Static Induction Thyristor, IEEE Transactions on Electron Devices, vol. ED-33, No. 4, Apr. 1986, pp. 507–515.

*Primary Examiner*—Jerome Jackson
*Assistant Examiner*—John Guay
*Attorney, Agent, or Firm*—Pollock, Vande Sande & Priddy

[57] ABSTRACT

An insulated gate bipolar transistor comprises a drain which supports a highly doped p-type substrate layer; a low doped n-type drift layer supported over the substrate layer; a base layer supported over the drift layer including a trench extending into the base layer, and supporting an insulated gate on an upper surface thereof separated from the trench by a highly doped n-type source region, the trench having a highly doped p-type layer at the bottom thereof vertically separated from the source region; and a source layer disposed over the n-type source region and extending into the trench covering the highly doped p-type layer in the trench bottom, wherein an applied voltage to the gate forms a conducting inversion channel in the base layer for electron transport from the source region to the drain, and the highly doped p-type layer in the bottom of the trench collects holes injected from the substrate layer into the drift layer thereby improving latch up immunity for the transistor.

14 Claims, 2 Drawing Sheets

INSULATED GATE BIPOLAR TRANSISTOR HAVING A TRENCH AND A METHOD FOR PRODUCTION THEREOF

FIELD OF THE INVENTION

The present invention relates to an insulated gate bipolar transistor (IGBT) comprising, superimposed: a drain; a highly doped p-type substrate layer; one of a) a highly doped n-type buffer layer and b) no such layer; a low doped n-type drift layer; a p-type base layer; a highly doped n-type source region layer; and a source. The transistor further comprises a trench etched into the base layer. An insulating layer with a gate electrode is arranged on the base layer, at least from the source region layer to the drift layer for forming, upon applying a voltage to the gate electrode, a conducting inversion channel in the base layer at the interface to the insulating layer for electron transport from the source to the drain, and an additional highly doped p-type layer. The invention also relates to a method for producing such a transistor.

BACKGROUND OF THE INVENTION

Such IGBTs may especially be used as switching devices in power applications where they are very advantageous, since they combine the preferred characteristic of bipolar junction transistor and MOSFETS, namely low conduction losses in the on-state, especially in devices with larger blocking voltages, and the possibility to be quickly turned on and off. These excellent switching properties of the IGBTs have in the past years resulted in replacement of other semiconductor switching devices by IGBTs in many applications, but a lot of research has been carried out for optimizing the function of these devices, since they have, in spite of their characteristics previously mentioned, some significant drawbacks.

This type of semiconductor device is particularly well suited for high power applications, and the invention is therefore advantageous in providing an IGBT having SiC as the semiconductor material, since it will then be possible to benefit from the superior properties of SiC especially in comparison with Si, namely, the capability of SiC to function well under extreme conditions. SiC has a high thermal stability due to a large bandgap energy, so that devices fabricated from this material can operate at high temperatures up to 1000° K. Furthermore, it has a high thermal conductivity, so that SiC devices may be arranged in high density. SiC also has a more than five times higher breakdown field than Si, so that it is well suited as a material in high power devices operating under conditions where high voltages may occur in the blocking state of a device. An IGBT made of this material has particularly low conduction losses in the on-state as compared to a MOSFET. However, it is emphasized that the invention is not in any way restricted to this choice of semiconductor material, but any semiconductor material, such as Si, is conceivable.

Furthermore, it has to be mentioned that the trench has not to be as deep as is normally in so called trench IGBTs, but it may be considerably more shallow.

The major example of the drawbacks mentioned above for IGBTs already known arises from the fact that an IGBT has three pn-junctions in series and by that a thyristor-like structure. This results in problems with so-called latchup in the on-state. This problem, as well as other drawbacks related thereto, will now be explained in reference to FIG. 1 of the appended drawings illustrating a prior art IGBT having, superimposed, a drain 1', a highly doped p-type substrate layer 2' for forming a good ohmic contact to the drain, a highly doped n-type buffer layer 3', a low doped n-type drift layer 4', and a p-type base layer 5'. The later preferably is moderately doped, but may also be differently doped in different regions thereof, e.g. a highly doped n-type source region layer 6' and a source 7'.

The device has also a trench 8' in the base layer 5', and the walls and the bottom of the trench are covered with an insulating layer 9' and a gate electrode 10' on top thereof. By applying a voltage above a threshold voltage value to the gate electrode 10', a conducting inversion channel may be created at the interface between the base layer 5' and the insulating layer 9' for conducting electrons from the source region layer 7' to the drift layer 4' and turning the device on.

The device may very quickly be turned off by cutting off the voltage supply to the gate electrode. This is the normal operation of the IGBT, but this function is only there in a so-called safe operating area (SOA).

Outside this area, the following mechanism will appear. Since an IGBT has a highly doped substrate layer 2', the electron current (indicated by arrow 11') flowing through the inversion channel and towards the drain causes a substantial hole injection from the substrate layer 2' into the drift layer 4'. The holes move across the drift layer, taking a variety of paths 12', and reach the base layer 5'. Also, they will move towards the source 7' for recombining with electrons from the source. The hold paths 12' will go around the lower trench corner 13', since the holes are attracted by the negative charge of the electrons in the inversion channel which results in an electrical field concentration there which may, when it is high enough, cause the insulating layer to burn there and the device to be destroyed. Furthermore, the paths 12' will accordingly extend laterally through the base layer below the highly doped n-type source region layer 6' and they will feel the lateral spreading resistance indicated at 14' of the base layer. This, in turn, results in a lateral voltage drop in the base layer along the junction between the base layer 5' and the source region layer 6'. This tends to forward bias the junction, and if the voltage is large enough, substantial injection of electrons from the source region layer into the base layer occurs and the parasitic thyristor composed of the two parasitic npn and pnp transistors created in this way will latch on, and a latchup of the IGBT has thereby occurred. Once the IGBT is in latchup, the gate no longer has any control of the drain current. The IGBT may then only be turned off in the same way as a conventional thyristor. If the latchup is not terminated quickly, the IGBT will be destroyed by excessive power dissipation. There is a critical value of drain current which will cause a large enough lateral voltage drop to activate the thyristor.

Attempts have been made to solve these problems, and a trench-IGBT according to the introduction has been described by Constapel, Korec and Baliga in "Proceedings of 1995 International Symposium on Power Semiconductor Devices and ICs, Yokohama." It further describes that IGBT has an additional highly doped p-type layer located at the bottom of the trench in the drift layer next to the insulating layer, thereby separating the drift layer from the gate electrode. The holes, or a large fraction thereof otherwise injected into the base layer during forward conduction, and going under the source region layer, and by that causing a lateral voltage drop, will not instead, enter the highly doped additional layer and are diverted through a separate diverting circuit to the source of the device. In this way, a higher drain current may be accepted than in the prior art devices according to FIG. 1 and the safe operating area may be increased. However, a disadvantage of this device is that a separate diverting circuit has to be applied for the holes. Furthermore, it would, of course, be desired to further extend the safe operating area of such an IGBT.

SUMMARY OF THE INVENTION

The object of the present invention is to provide an IGBT of the type defined in the introduction, which is simply constructed and has a large safe operating area due to a high latchup tolerance.

This object is, in accordance with the present invention, obtained by arranging an additional layer separated from the source region layer and having the source applied thereon for collecting holes injected on the substrate layer to the drift layer at a distance from the source region layer.

In this way, the source contact for the electrons and the holes is efficiently separated, so that the paths for the holes do not pass the source region layer any longer. Consequently, a hole bypass construction is created thereby leading to a high latchup tolerance and a large safe operating area.

According to a preferred embodiment of the invention, at least a portion of the additional highly doped p-type layer is located under the bottom of the trench, which is an advantageous position for preventing the holes from passing under the source region layer.

According to another preferred embodiment of the invention, the additional highly doped p-layer is arranged on the top of the base layer for separation from a space charge region located at a junction between the base layer and the drift layer, which means that the space charge region will not reach the additional layer, and there will be no high electric field concentration there.

According to a further preferred embodiment of the invention the trench is carried out deeply into the base layer. This results in a diversion of the hole paths at a comparatively large distance from the source region layer thereby increasing the safe operating area.

According to another preferred embodiment of the invention the drift layer is arranged to surround the base layer laterally with the latter separated laterally from the source region layer and the trench, and the insulating layer and the gate electrode on top thereof are arranged on top of the base layer over the lateral extension thereof from the drift layer to the surface region layer forming, upon applying of a voltage to the gate electrode, the inversion channel with a lateral extension in the base layer. Such a lateral channel will considerably increase the channel mobility of such an IGBT, since the trap density at the interface between the base layer and the insulating layer will be much lower with this location of the surface channel, since the surface of the base layer may be formed by epitaxial growth, whereas the vertical trench wall of a device with a vertical channel has to be formed by etching, or the like, giving rise to a higher concentration of traps. Another important advantage of such a lateral surface channel is that the electron flow is separated from the trench, particularly the lower corner thereof. As a result, there will be no electron current attracting the holes injected in the drift layer in the region of the corner, avoiding any electric field concentration there. As a result of the arrangement of the gate electrode far away from the corner, and the removal of the insulating layer therefrom, the electric field will be much lower at the corner.

According to another preferred embodiment of the invention the source is arranged to at least partially cover the trench. This is particularly advantageous in combination with the positioning of the gate electrode according to the previous embodiment due to the increased latchup immunity and decreasing of the electric field at the trench corner as a result of shifting places of the gate and the source with respect to prior art IGBTs.

According to another preferred embodiment, the transistor comprises an additional insulating layer arranged between the base layer and the source, and the additional insulating layer is located next to the additional highly doped p-type layer and extends therefrom at least substantially to the source region layer for forcing substantially all the holes injected from the substrate layer to the drift layer to the source through the additional highly doped p-type layer at a distance from the source region layer. As a result of the arrangement of such an additional insulating layer, no holes entering the base layer may reach the source at any location between the source region layer and the additional highly doped p-type layer; but instead, the entire current of holes will be forced to the additional layer thereby further increasing the latchup tolerance and as a consequence, also the safe operating layer of the device.

According to a still further preferred embodiment of the invention, the layers, except from the insulating layers, are made of SiC. By constructing such a device of SiC, it is possible to maximally benefit from the advantages of an IGBT and the greatly improved latchup immunity of the IGBT according to the invention for applying such a device in high power applications.

A further object of the invention is to provide a method for producing an insulated gate bipolar transistor, for which the drawbacks of prior art IGBTs are considerably reduced. Such a method is, according to the invention, defined in the appended independent method claim.

An IGBT formed in accordance with that method will have an improved latchup immunity, an improved channel mobility, and lower concentration of electrical field at the lower trench corner than prior art IGBTs. The key to obtaining such a device is the steps of carrying out a MESA etching for forming a groove in the drift layer, epitaxially growing the base layer in the groove and creating the source region layer, as well as the additional highly doped p-type layer, by using the implantation technology. This method enables the production of IGBT of SiC, in which the diffusitivity of dopants is remarkably reduced in comparison to, especially, Si.

Further advantages and preferred features of the invention will appear from the following description and the claims.

BRIEF DESCRIPTION OF THE DRAWINGS

With reference to the appended drawings, below follows a specific description of preferred embodiments of the invention.

In the Drawings.

DETAILED DESCRIPTION OF PREFERRED EMBODIMENT(S)

Figure 2:
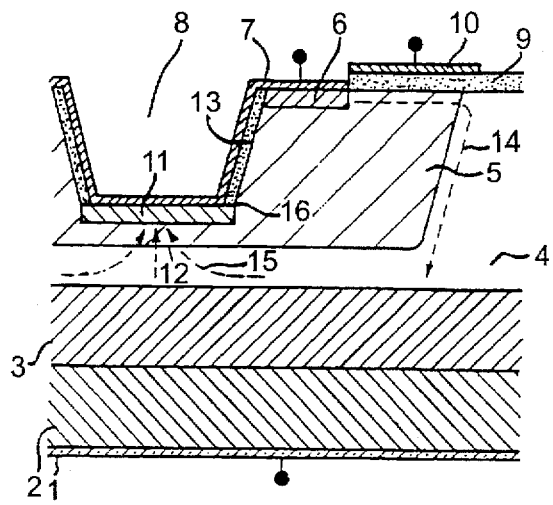
FIG. 2 is a cross-sectional view corresponding to that of FIG. 1 of an IGBT according to a first preferred embodiment of the present invention.
Figure 3:
FIGS. 3–6 are schematic cross-sectional views illustrating different steps of a method for producing an IGBT having the features of the IGBT according to FIG. 2.
Figure 4:
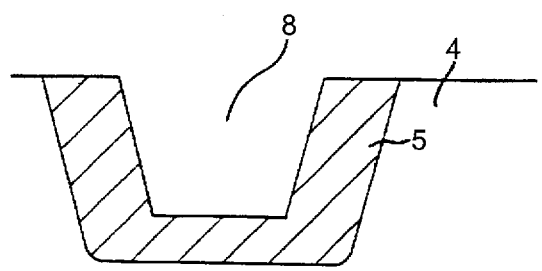
Figure 5:
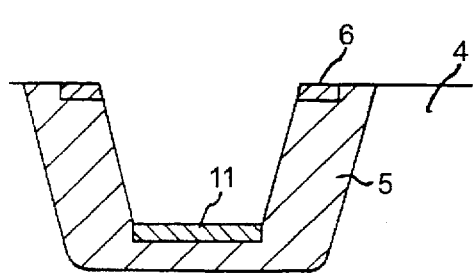

FIG. 2 illustrates an insulated gate bipolar transistor (IGBT) according to a first preferred embodiment of the invention. The parts corresponding to parts of the prior art transistor described above are provided with the same reference numerals but with the index ' removed. Consequently, the transistor has a superimposed drain 1, a highly doped p-type substrate layer 2 for forming a good ohmic contact to the drain, a highly doped n-type buffer layer 3 arranged for preventing a reach-through of the depletion layer to the substrate layer, a low doped n-type drift layer 4, a p-type base layer 5 which preferably is moderately doped but which may have a varying doping concentration or made of two or more differently doped p-type layers, a highly doped n-type source region layer 6, and a source 7. The base layer 5 is immersed in the drift layer 4, so that it is laterally surrounded thereby, whereas the source region layer 7 is immersed in the base layer 5 so that the source region layer and the drift layer are laterally separated by the base layer. The transistor further comprises a trench 8 carried out in the base layer 5 to a considerably depth thereof which, in this case, means a depth well exceeding the half of the maximum depth of the base layer. An insulating layer 9 in the form of a gate oxide and a gate electrode 10 supported thereon are arranged on the base layer and extend at least from the source region layer to the drift layer.

The transistor also comprises an additional highly doped p-type layer 11 arranged at the bottom of the trench 8, immersed in the base layer 5, and having such a thickness of the base layer 5 located thereunder that it will be separated from a space charge region created at the junction 12 between the base layer and the drift layer. An additional insulating layer 13 is arranged between the base layer 5 and the source 7, and it is located next to the additional layer 11 and extends therefrom to the source region layer 6. The source 7 is, accordingly, in direct contact with the source region layer 6 and by the extension down into, and covering, the trench 8 with the additional highly doped p-type layer; however, it is separated from the base layer 5 by the additional insulating layer 13.

Figure 6:
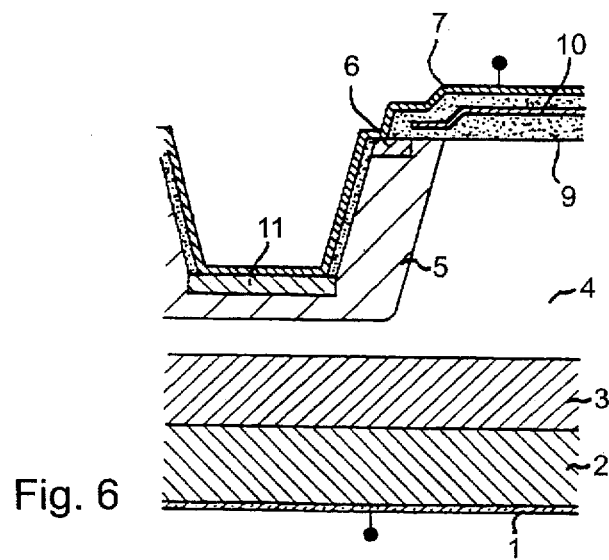

The transistor shown in FIG. 2 may be considered to end at the vertical symmetry line of the trench 8, and a similar transistor is formed to the left of this symmetry line in a mirror image relation to the one shown to the right. The construction of the transistor is somewhat simplified in FIG. 2, and FIG. 6 shows some more details thereof.

The function of the insulated gate bipolar transistor according to FIG. 2 will be as follows. Upon application of a voltage over a certain threshold voltage level on the gate electrode 10, a conducting inversion channel will be created at the interface between the base layer 4 and the insulating layer 9 for transport of electrons between the source region layer 6 and the drift layer 4 and turn the transistor on if a forward bias is applied over the source and drain thereof. Thus, an electron flow indicated by the dashed arrow 14 from the source 7 to the drain 1 will result. This electron flow will cause hole injection from the substrate layer 2 into the drift layer 4, which is indicated by the dashed arrows 15. These holes will try to reach the source for recombining with the electrons thereof. The additional highly doped p-type layer 11 will function as a p-well and the holes will move to the source through this layer 11. Because of the arrangement of the additional insulating layer 13, all the current of holes will be forced to the additional layer 11 under the trench bottom, since they may not reach the source through the vertical wall of the base layer 5. Accordingly, any voltage drop in the base layer will be far from the source region layer and not therealong, so that a very high drain current may be tolerated before the junction between the source region layer 6 and the base layer 4 is considerably forward biased so that a greatly improved latchup immunity is obtained.

Furthermore, the separation of the inversion channel from the lower trench corner 16 will also prevent any electric field concentration from occurring near the trench corner.

With reference to FIGS. 3–6, a method for producing an insulating gate bipolar transistor according to FIG. 2 will now be described. This method is particularly suited for producing such an IGBT of SiC. First of all the layers 2, 3 and 4 are epitaxially grown on top of each other, and thereafter a MESA etching is carried out to form a groove 17 in the drift layer 4. Then a p-type base layer 5 is epitaxially grown in the groove. Then n-type dopants are implanted into a surface layer of the base layer to form a highly doped n-type source region layer 6 laterally separated from the drift layer 4. Traditional techniques of masking and demasking are used for accomplishing the different layers, but they have been omitted in the Figures. Next, the trench 8 is etched into the base layer 4, leaving the source region layer at the upper corner of the trench. Although it appears from FIG. 4 as if the trench etching was done before, but this is not the case.

Then p-type dopants are implanted into the trench in the surface region of at least the bottom thereof for forming an additional highly doped p-type layer 11. Finally, a gate oxide 9 is applied on the top of a part of the source region layer, and the base layer and the drift layer, and a gate electrode 10, preferably made of polycrystalline silicon, are applied. On top thereof, an insulating oxide is applied, and an additional insulating layer 13 is applied on the vertical trench wall. A source metallization 7 is applied upon everything for forming a contact to the additional layer 11 and the source region layer 6.

By forming a surface inversion channel, which is here lateral, this surface channel will have a high mobility as compare to the vertical channel of prior art since it is formed between a semiconductor layer surface epitaxially grown and an insulating layer, whereas the vertical wall of the trench created by etching is not used at all for conducting purposes.

Figure 1:
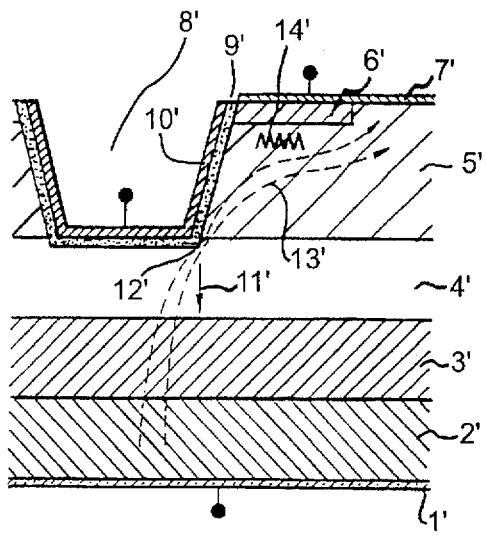
FIG. 1 is a schematic cross-sectional view of an IGBT according to the prior art.
Figure 7:
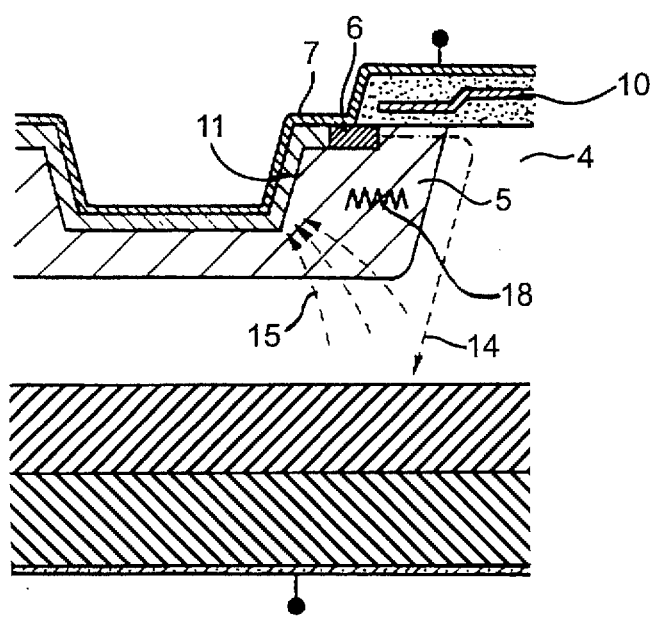
FIG. 7 is a cross-sectional view, corresponding to that of FIG. 2, of an IGBT according to a second preferred embodiment of the invention.

An insulated gate bipolar transistor according to a second preferred embodiment of the invention is shown in FIG. 7. This differs from the one shown in FIG. 6 by having a trench which is not as deep as the trench in the transistor according to FIG. 2. The additional p-type layer 11 is created by implantion of p-type dopants into the entire trench. No additional insulating layer is provided between the base layer 5 and the source 7, but only the additional layer 12. This is a somewhat simplified way of constructing an IGBT according to the invention which will result in an increased safe operating area with respect to the prior art devices shown in FIG. 1. This is because the paths 15 of the holes will be at a greater distance from the source region layer, and the voltage drop across the base layer resistance 18 will be lower and far away from the critical junction. Because of the lateral surface channel and the separation of the gate from the trench, there will be no electric field concentration at the lower trench corner, and the channel mobility will also be remarkably increased with respect to IGBTs having vertical inversion channels.

The invention is of course not in any way restricted to the preferred embodiments described above, but many of the modifications thereof will be apparent to a person skilled in the art without departing from the basic idea of the invention.

It is emphasized that the thicknesses of the different layers in the Figures cannot be interpreted as limiting the scope of protection, but any thickness relations are intended to be covered by the claims.

Furtheremore, the buffer layer does not have to be there, but is used when lower on-state losses are desired.

Furthermore, the definition of "superimposed" in the claims is to be interpreted broadly and means that there is a contact in the vertical direction between such subsequent layers, so that, for instance, the additional layer in FIG. 2 may be defined as superimposed on the base layer although the base layer has a vertical extension upwardly beyond the additional layer. The dopants used may be of any material suitable as dopants for this application.

The claim definition that the source region layer is provided with a lateral extension from an upper corner of the trench does not exclude that it also may have portions which extend in other directions such as down into the trench.

The independent patent claim concerning the method for producing an insulated gate bipolar transistor does, of course, not include every step necessary for producing such a transistor, but several conventional steps of semiconductor technologies will also be used.

The claim definition that the source region layer is provided with a lateral extension from an upper corner of the trench does not exclude that it also has portions extending in other directions, such as down into the trench.

"Substrate layer" in this disclosure is to be interpreted as the layer closest to the drain of the layers mentioned herein and it is not required to be a substrate layer in the strict sense of this word within this field, i.e. the layer from which the growth is started. The real substrate layer may be any of the layers and is mostly the thickest one, such as the drift layer.

The method claims are to be interpreted as not restricted to a growth of the layers located on top of each other in the order they are mentioned, but any other order of growth of these layers is within the scope of the claims. For instance, the method may be started from the drift layer and the so-called substrate layer and the drain may be grown at the very end of the method.

We claim:

1. An insulated gate bipolar transistor comprising:

a drain which supports a highly doped p-type substrate layer;

a low doped n-type drift layer supported over said substrate layer;

a base layer supported over said drift layer including a trench extending into said base layer, and supporting an insulated gate on an upper surface thereof separated from said trench by a highly doped n-type source region, said trench having a highly doped p-type layer at the bottom thereof vertically separated from said source region;

a source layer disposed over said n-type source region and extending into said trench covering said highly doped p-type layer at said trench bottom, and an additional insulating layer extending into said trench and positioned between said base layer and said source layer, and wherein an applied voltage to said gate forms a conducting inversion channel in the base layer for electron transport from said source region to said drain, and said highly doped p-type layer in the bottom of said trench collects holes injected from said substrate layer into said drift layer thereby improving latch up immunity for said transistor.

2. The insulated gate bipolar transistor according to claim 1 further comprising an n-type buffer layer between said drift layer and said substrate layer.

3. The insulated gate bipolar transistor according to claim 1 wherein said highly doped p-type substrate layer, said drift layer, said base layer, said source region layer, and said highly doped p-type layer are made of SiC.

4. The insulated gate bipolar transistor according to claim 2 wherein said highly doped p-type substrate layer, said drift layer, said base layer, said source region layer, and said highly doped p-type layer are made of SiC.

5. The insulated gate bipolar transistor according to claim 1, wherein at least a portion of said highly doped p-type layer is located at said trench bottom.

6. The insulated gate bipolar transistor according to claim 1, wherein substantially the entire highly doped p-type layer is located at said trench bottom.

7. The insulated gate bipolar transistor according to claim 1, wherein said highly doped p-type layer is located in said trench on said base layer separated from a space charge region created at a junction between said base layer and said drift layer.

8. The insulated gate bipolar transistor according to claim 1, wherein said trench extends deeply into said base layer.

9. The insulated gate bipolar transistor according to claim 1, wherein said trench extends more than halfway into said base layer.

10. The insulated gate bipolar transistor according to claim 1, wherein said drift layer laterally surrounds said base layer separating said drift layer from the source region layer and said trench, and wherein said insulating layer supporting said gate electrode thereon is arranged on top of said base layer over the lateral extension thereof from the drift layer to the source forming, upon applying of a voltage to said gate electrode, said inversion channel with a lateral extension in said base layer.

11. The insulated gate bipolar transistor according to claim 1, wherein said source layer at least partially covers walls of said trench.

12. The insulated gate bipolar transistor according to claim 1, wherein said source layer covers at least a part of the bottom of said trench.

13. The insulated gate bipolar transistor according to claim 1, wherein said source region layer is provided with a lateral extension from an upper corner of said trench.

14. The insulated gate bipolar transistor according to claim 1 wherein said additional insulating layer is located in said trench next to said highly doped p-type layer and extends therefrom at least substantially to said source region layer for forcing substantially all said holes injected from said substrate layer to said drift layer to the source through said highly doped p-type layer at a distance from said source region layer.

* * * * *